(12) United States Patent
Shirakawa

(10) Patent No.: US 6,882,026 B2
(45) Date of Patent: Apr. 19, 2005

(54) SEMICONDUCTOR APPARATUS AND PROCESS FOR PRODUCING THE SAME, AND PROCESS FOR MAKING VIA HOLE

(75) Inventor: Kazuhiko Shirakawa, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/156,558

(22) Filed: May 29, 2002

(65) Prior Publication Data

US 2002/0179913 A1 Dec. 5, 2002

(30) Foreign Application Priority Data

May 29, 2001 (JP) ........................................ 2001-160783

(51) Int. Cl.[7] ............................................. H01L 21/265
(52) U.S. Cl. ........................ 257/521; 257/628; 257/79
(58) Field of Search ........................ 257/79, 94, 95–97, 257/44, 46, 587, 197, 712, 767, 584, 692, 81, 99, 88, 527, 521, 628; 438/44, 22, 42, 122, 149, 700, 701

(56) References Cited

U.S. PATENT DOCUMENTS

| | | | |
|---|---|---|---|
| 5,341,021 A | * | 8/1994 | Maeda et al. ............... 257/587 |
| 5,378,926 A | | 1/1995 | Chi et al. |
| 5,864,169 A | | 1/1999 | Shimura et al. |
| 6,168,964 B1 | * | 1/2001 | Hamaguchi ................. 438/44 |

FOREIGN PATENT DOCUMENTS

| | | |
|---|---|---|
| JP | 54-82182 A | 6/1979 |
| JP | 58-92269 A | 6/1983 |
| JP | 59-94818 A | 5/1984 |
| JP | 2-28927 A | 1/1990 |
| JP | 8-279562 A | 10/1996 |
| JP | 11-102912 A | 4/1999 |

OTHER PUBLICATIONS

Chen et al., Parametric study of InP Backside processing using high frequency plasma etching, Conference Proceedings, 2000, pp. 186–189.*

* cited by examiner

*Primary Examiner*—Long Pham
*Assistant Examiner*—(Vikki) Hoa B. Trinh
(74) *Attorney, Agent, or Firm*—Birch, Stewart, Kolasch & Birch, LLP

(57) ABSTRACT

In a semiconductor apparatus, a plurality of HBTs (heterojunction bipolar transistors) are formed on a front surface consisting of a (100) crystal plane of a GaAs substrate. Via holes passing thorough the GaAs substrate are formed in proximity of the HBTs. Each via hole has a rectangular-shaped hole edge at the front surface side of the GaAs substrate. The longitudinal direction of the hole edge on the surface side of the via hole is parallel to the [011] direction of crystal orientation of the GaAs substrate. A width of the via hole in a direction perpendicular to the [011] direction of crystal orientation is larger at the back surface of the substrate than at the front surface thereof.

8 Claims, 11 Drawing Sheets

SEMICONDUCTOR APPARATUS AND PROCESS FOR PRODUCING THE SAME, AND PROCESS FOR MAKING VIA HOLE

BACKGROUND OF THE INVENTION

The present invention generally relates to a semiconductor apparatus having high-frequency and high-output semiconductor elements, which is used for, for example, radio-communication equipment and so on, and a process for producing the same. Particularly, the present invention relates to via holes used in such a semiconductor apparatus and a process for fabricating the via holes.

Semiconductor apparatuses disclosed in JP-A-59-94818 and JP-A-8-279562 have a substrate having a front surface and a back surface, semiconductor elements formed on the front surface of the substrate, and a backside metal layer formed on the back surface of the substrate. The semiconductor apparatus is also provided with via holes passing through the substrate in proximity of the semiconductor elements. At least one electrode of each semiconductor element is connected to the backside metal layer through a metal wiring within each via hole. Thereby, the wiring resistance and the inductance of the semiconductor apparatus are reduced compared with the case where a package is connected to semiconductor elements with Au wires.

In a semiconductor apparatus having high-frequency and high-output semiconductor elements, it has been an important task to carry out a reduction in the grounding inductance and the heat resistance. A high grounding inductance would cause the deterioration of the high-frequency characteristics. Further, if the heat resistance is high, device characteristics will become unstable due to the self-heat of the elements generated when operating.

In order to reduce the grounding inductance and the heat resistance, a construction has been proposed in which metal wirings are formed within via holes passing through a substrate, and electrodes of high-frequency and high-output elements are connected to the wirings within the via holes, thus connecting a backside metal layer provided on the backside of the substrate to the electrodes.

As a process for producing a semiconductor apparatus, there has hitherto been a method in which dry etching according to a reactive ion etching ("RIE") method using chlorine gas is performed to form, as shown in FIG. 10, etching holes 267 for forming via holes in a substrate 201 in proximity of high-frequency, high-output elements 200 as shown in FIG. 10. Thereafter, although not shown, via holes are formed using the etching holes 267 by polishing the backside of the substrate 201.

In the conventional process for producing a semiconductor apparatus, if the depth of the etching holes 267 increases, the etching rate is varied depending on the crystal orientation of the substrate 201, and side walls of the etching holes 267 become oblique with respect to the top surface of the substrate 201. This is because of the following reasons: if the depth of the etching holes 267 increases, the ion density in plasma decreases during the dry etching process, and a chemical reaction due to ions is decelerated, resulting in the deterioration of the vertical processability, which is characteristic of the RIE method. Accordingly, the etching shape becomes similar to that obtained by wet etching.

In this way, the deeper the etching holes 267, the narrower the width of the etching holes 267 towards the backside. Therefore, when the opening size of the etching holes 267 at the front-surface is small, it is not possible to increase the depth of the etching holes 267. As a result, there is a problem in that deep via holes with a small opening size at the front-surface side cannot be formed using the etching holes 267.

SUMMARY OF THE INVENTION

An object of the present invention is to provide a semiconductor apparatus that enables the formation of deep via holes even if their opening size at the front-surface side is reduced, and a process for producing the same.

It is also an object of the present invention to provide a process of making a deep via hole in a substrate even if the opening size of the via hole at a front surface of the substrate is reduced.

FIG. 11 shows the etching shape of a rectangular-shaped pattern on a (100) plane of a GaAs substrate 111 when the substrate was etched with an aqueous hydrochloric acid solution. In one case, the longer side of the pattern is parallel to the [011] direction, while in the other case, the longer side is perpendicular to the [011] direction.

As shown in FIG. 11, the (100) plane of the GaAs substrate 111 is formed with rectangular-shaped hole edges 112, 113. The longitudinal direction of the hole edge 112 is parallel to the [011] direction, while the longitudinal direction of the hole edge 113 is parallel to the direction perpendicular to the [011] direction. The etching hole including the hole edge 112 takes an etching shape wherein the hole width increases toward the bottom, while the etching hole including the hole edge 113 takes an etching shape wherein the hole width decreases toward the bottom. In this manner, the cross-sectional etching shape in the GaAs substrate 111 varies depending on the crystal face orientation of the GaAs substrate.

The above finding led the present inventors to make the present invention.

According to an aspect of the present invention, there is provided a semiconductor apparatus comprising:

a GaAs substrate having a front surface and a back surface, the front surface consisting of a (100) crystal plane;

a plurality of semiconductor elements formed on the front surface of the GaAs substrate, each semiconductor element having a plurality of electrodes;

a surface metal layer connected to at least one of the electrodes of each semiconductor element and located above the semiconductor elements;

a backside metal layer provided on the back surface of the GaAs substrate;

via holes passing through the GaAs substrate and located in proximity of the semiconductor elements; and via hole conductors embedded within the via holes;

wherein at least one via hole is provided in correspondence with one semiconductor element, each via hole having a hole edge rectangular in shape at the front surface, and a longitudinal direction of the hole edge of the via hole is parallel to the [011] direction of crystal orientation of the GaAs substrate.

According to the semiconductor apparatus having the above construction, the via holes are formed in proximity of the semiconductor elements in a manner such that the hole edge at the front surface side of the GaAs substrate has a rectangular shape and that the longitudinal direction of the hole edge is parallel to the [011] direction of crystal orientation of the GaAs substrate. The via hole thus formed has a shape wherein the opening width in a direction perpendicular to the direction of the crystal orientation [011] increases as moving from the front surface of the GaAs substrate toward the backside thereof. Therefore, even if the opening on the front surface side is small, it is possible to form a deep via hole.

Further, since the heat generated in the semiconductor elements is radiated to the backside metal layer through the via hole conductors within the via holes, the cross sections of which become larger toward the backside metal layer, the heat resistance can be reduced, and also the inductance of the via hole conductors within the via holes can be reduced.

In one embodiment, a first wiring is formed between the surface metal layer and the at least one electrode of each semiconductor element, a second wiring is formed between the surface metal layer and the first wiring and between the via hole conductor and wall surfaces of each via hole. Also, an organic insulating film is formed between the first wiring and each semiconductor element.

In the semiconductor apparatus according to this embodiment, the first wiring and the second wiring are allowed to be connected to the backside metal layer through the surface metal layer and the via hole conductor.

In one embodiment, the second wiring consists of a laminated film of titanium/platinum/gold. This arrangement can increase the adhesion of the second wiring to the GaAs substrate.

In one embodiment, each semiconductor element is at a distance of 2 μm or more from the hole edge of the associated via hole.

In this embodiment, the distance of 2 μm or more between the hole edge of the via hole and the associated semiconductor element can suppress a leak current in the semiconductor element. Thus, and an improvement in the element characteristics and the reliability can be realized.

In one embodiment, the backside metal layer is only formed in a place confronting and surrounding the via holes.

With this arrangement, lines such as, for example, a grounding wiring, a signal line, and a power source line, which are provided by the surface metal layer, can be connected with the via hole conductors. Thus, a reduction in the resistance and inductance of the respective wirings can be carried out, which makes it possible to achieve an improvement in the performance of the semiconductor elements.

In one embodiment, the backside metal layer is formed of an alloy of gold and tin. Thus, by heating the backside metal layer to about 300° C. when assembling the apparatus on a printed circuit board, for example, the GaAs substrate can be connected to the printed circuit board through the backside metal layer.

Also, in this embodiment, heat generated at the time of the operation of the elements is transferred to the backside metal layer through the metal wirings within the via holes and radiated through the backside metal layer. Since the backside metal layer is made of the alloy of gold and tin, the heat resistance of the backside metal layer is low, and the operation heat of the semiconductor elements is radiated or dissipated efficiently. Accordingly, the characteristics of the semiconductor elements are prevented from becoming unstable in spite of the heat generation at the time of the operation, and an improvement in the reliability of the semiconductor elements can be realized.

Also, according to another aspect of the present invention, there is provided a process for producing a semiconductor apparatus comprising:

forming a plurality of semiconductor elements on a (100) crystal plane of a GaAs substrate, the (100) crystal plane constituting a front surface of the GaAs substrate;

forming wiring layers for providing a parallel connection of the semiconductor elements;

etching the (100) crystal plane of the GaAs substrate to form etching holes in the GaAs substrate in proximity of the semiconductor elements, each etching hole having a hole edge rectangular in shape at the front surface, a longitudinal direction of the hole edge of the etching hole being parallel to the [011] direction of crystal orientation of the GaAs substrate, and a cross-sectional area of each etching hole is larger inside the GaAs substrate than at the front surface of the GaAs substrate;

forming via hole conductors that fill the etching holes;

forming a surface metal layer connected to electrodes of the semiconductor elements and located above the semiconductor elements;

removing a backside of the GaAs substrate to form, from the etching holes, via holes passing through the GaAs substrate, each via hole having an hole edge rectangular in shape at the front surface, and the longitudinal direction of the hole edge being parallel to the [011] direction of crystal orientation of the GaAs substrate; and providing the backside of the GaAs substrate with a backside metal layer such that the surface metal layer is connected to the backside metal layer through the via hole conductor.

According to the process for producing the semiconductor apparatus, the plurality of semiconductor elements are formed on the (100) crystal plane of the GaAs substrate, and the wiring layers for providing the parallel connection are formed. Then, etching is performed on the (100) crystal place of the GaAs substrate, so as to form the etching holes for forming the via holes in the GaAs substrate in proximity of the semiconductor elements. At this time, the etching hole has the hole edge which has the rectangular shape on the front surface side, and the longitudinal direction of the hole edge is parallel to the [011] direction of crystal orientation of the GaAs substrate. Thereby, the width of the etching hole increases as going from the front surface of the GaAs substrate toward the backside thereof. Therefore, even if the opening on the front surface side is small, it is possible to form a deep etching hole for forming a via hole. The use of the etching hole makes it possible to form a deep via hole.

In one embodiment, before forming the via hole conductors and the backside metal layer, a first wiring connected to an electrode of each semiconductor element is formed and a second wiring is formed on the first wiring while rotating and revolving the GaAs substrate.

According to the process for producing the semiconductor apparatus of the above embodiment, since the second wiring is formed on the first wiring, with the GaAs substrate being rotated and revolved, it is possible to make the film thickness of the second wiring uniform.

In one embodiment, before removing the backside of the GaAs substrate, an organic protective film is formed on the surface metal layer and a supporting substrate is formed on the organic film through a sheet provided with adhesive layers on its opposite surfaces. The adhesive layers have adhesive strength weakened by heating.

According to the process for producing the semiconductor apparatus of the above embodiment, the supporting substrate is bonded to the organic protective film formed on the surface metal layer via the sheet having on both sides the adhesive layers whose adhesion strength is lowered by heating. Then, the backside of the GaAs substrate is removed by polishing, for example, and then the supporting substrate is removed from the GaAs substrate. At this time, by heating the adhesive layers, the adhesive layers are foamed, thus deteriorating in the adhesion. Thus, the supporting substrate can easily be removed from the GaAs substrate. Accordingly, handling performance at the time of removing the supporting substrate from the GaAs substrate is improved.

Further, the supporting substrate can easily be removed from the GaAs substrate without any difficulty by heating the adhesive layers. Thus, when removing the supporting substrate, cracks are prevented from occurrence in the GaAs substrate, making it possible to suppress a reduction in the yield due to the cracks in the GaAs substrate.

According to another aspect of the present invention, there is provided a transceiver which has the above-described semiconductor apparatus.

Since the transceiver has the semiconductor apparatus, a high-efficiency, high-gain performance can be realized. Thus, reduction in the power consumption can be achieved.

The present invention also provides a process for making a via hole in a substrate having a front surface and a back surface, the front surface consisting of a (100) crystal plane, the process comprising:

etching the front surface of the substrate to form an etching hole in the substrate such that a hole edge at the front surface of the substrate is rectangular in shape and that longer sides of the hole edge extend in a direction parallel to the [011] direction of crystal orientation of the substrate;

filling the etching hole with an electrically conductive material; and removing a backside of the substrate until the conductive material in the etching hole is exposed to thereby form the via hole through the substrate.

Also, the present invention provides a substrate formed with a via hole therethrough, wherein the substrate has a front surface consisting of a (100) crystal plane, and wherein the via hole has a hole edge at the front surface of the substrate which edge is rectangular in shape, and longer sides of the hole edge extend in a direction parallel to the [011] direction of crystal orientation of the substrate.

In the substrate, a width of the via hole in a direction perpendicular to the [011] direction of crystal orientation is larger at the back surface of the substrate than at the front surface thereof.

In one embodiment, the hole edge of the via hole at the front surface of the substrate has a width of 5 to 20 $\mu$m and a length of 30 to 60 $\mu$m and the via hole has a depth of 100 $\mu$m or more.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The semiconductor apparatus and process for producing the same of the present invention will be explained in detail by illustrated examples.

Figure 1A:
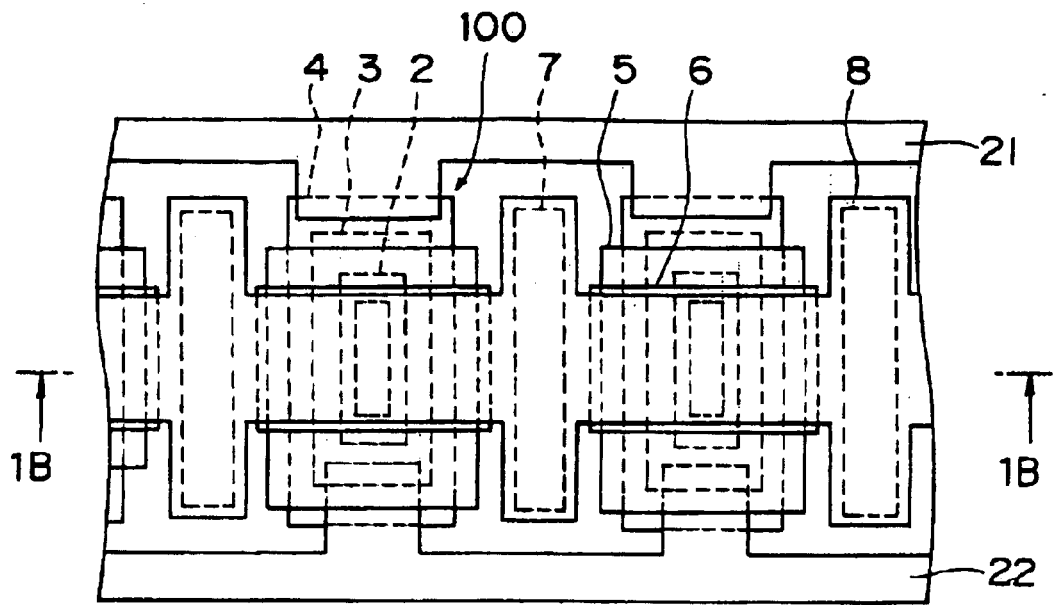
FIG. 1A is a schematic top plan view of an essential part of a semiconductor apparatus according to one embodiment of the present invention and FIG. 1B is a schematic cross-sectional view taken along line 1B—1B of FIG. 1A.
Figure 1B:
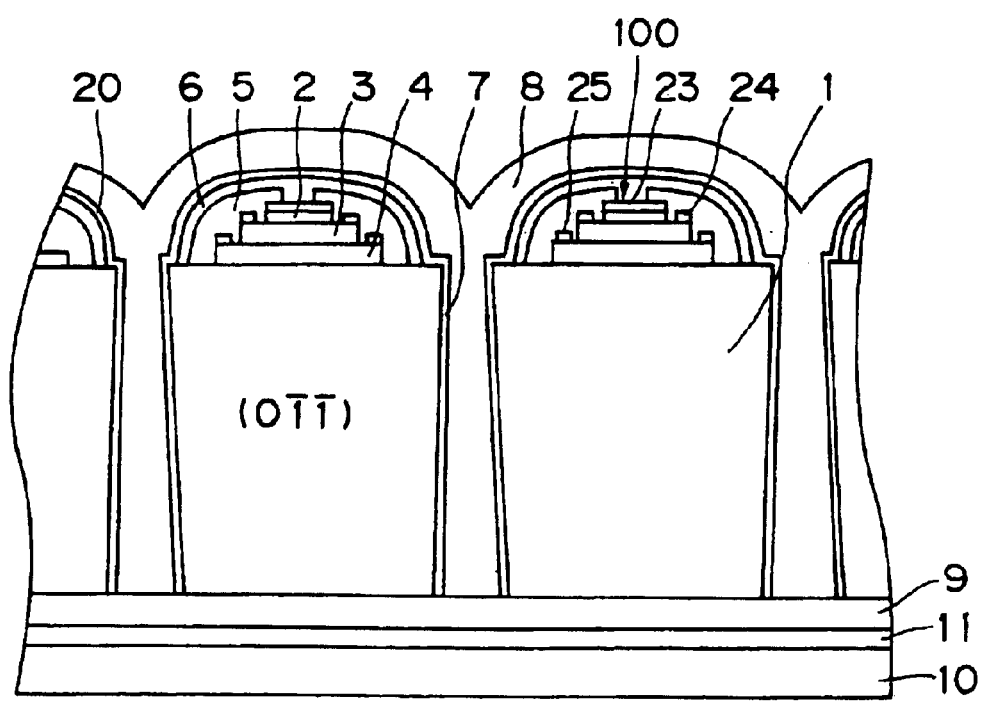

FIG. 1A is a schematic top plan view of an essential part of a semiconductor apparatus according to one embodiment of the present invention, and FIG. 1B is a schematic cross-sectional view taken on line 1B—1B of FIG. 1A. In FIG. 1A, emitter ohmic metal layers, base ohmic metal layers and collector ohmic metal layers are omitted for the sake of simplicity.

As shown in FIG. 1B, the semiconductor apparatus includes a GaAs substrate 1 with a front surface consisting of a (100) crystal face or plane, a plurality of heterojunction bipolar transistors (hereinafter referred to as "HBTs") 100 as one example of semiconductor elements formed on the front surface of the GaAs substrate, a surface metal layer 8 located above the HBTs 100 and connected to an emitter ohmic metal layer 23 (which is one of electrodes) of each HBT 100, a backside metal layer 9 provided on a back surface of the GaAs substrate 1, and a plurality of via holes 7 passing through the GaAs substrate 1 and located in proximity of the HBTs 100. A part of the surface metal layer 8 is embedded within each via hole 7. The via hole 7 has an edge taking a rectangular shape on the front-surface side, namely on the side of the HBTs 100. The longitudinal direction of the via hole edge is parallel to the [011] direction of crystal orientation of the GaAs substrate 1. Incidentally, reference numeral 10 in FIG. 1B indicates a printed circuit board, and reference numeral 11 indicates wiring of the printed circuit board.

The HBTs 100 each have a collector layer 4, a base layer 3 and an emitter layer 2 stacked in order on the front surface of the GaAs substrate. A surface of this emitter layer 2 takes a rectangular shape wherein the shorter side is in the range of 1 µm–6 µm, and the longer side is in the range of 10 µm–50 µm, for example. Further, a collector ohmic metal layer 25 is formed on the collector layer 4, a base ohmic metal layer 24 is formed on the base layer 3, and an emitter ohmic metal layer 23 is formed on the base layer 3. Further, as shown in FIG. 1A, the HBTs 100 are connected in parallel by a collector metal layer 21 and a base metal layer 22, which each are a wiring layer for providing a parallel connection.

Further, as shown in FIG. 1B, a first wiring 6 is formed between the surface metal layer 8 and the emitter ohmic metal layer 23 of the HBT 100. A feeding metal wiring 20, which is one example of a second wiring, is formed between the surface metal layer 8 and the first wiring 6 and between the surface metal layer 8 and wall surfaces of the via hole 7. Between the first wiring 6 and the HBT 100, a polyimide resin 5, which is one example of an organic insulating film, is formed.

According to the semiconductor apparatus having the above construction, the via hole 7 is formed in a manner such that the hole edge on the HBT 100 side takes a rectangular shape, and that the longitudinal direction of the hole edge is parallel to the [011] direction of crystal orientation of the GaAs substrate. The width of the via hole 7 thus formed increases from the front side of the GaAs substrate 1 toward the backside thereof. Therefore, it is possible to form a deep via hole 7 even if the hole size on the HBT 100 side is small.

Since the self heat of the HBTs 100 is radiated toward the backside metal layer 9 through the surface metal layer 8 within the via holes 7 of which the cross sections become larger toward the backside metal layer 9, the heat resistance is reduced. Together with this, the inductance of the surface metal layer 8 within the via holes 7 is reduced.

Figure 6A:
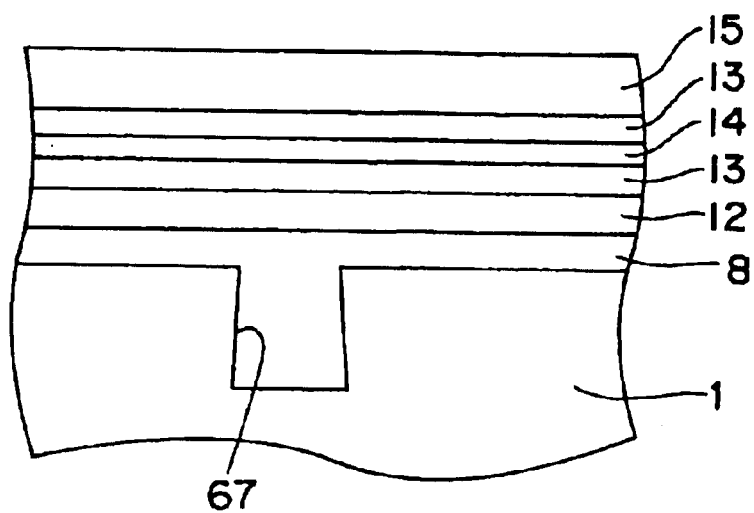
FIG. 6A through FIG. 6C are cross-sectional views showing a process for producing a semiconductor apparatus according to the present invention.
Figure 6B:
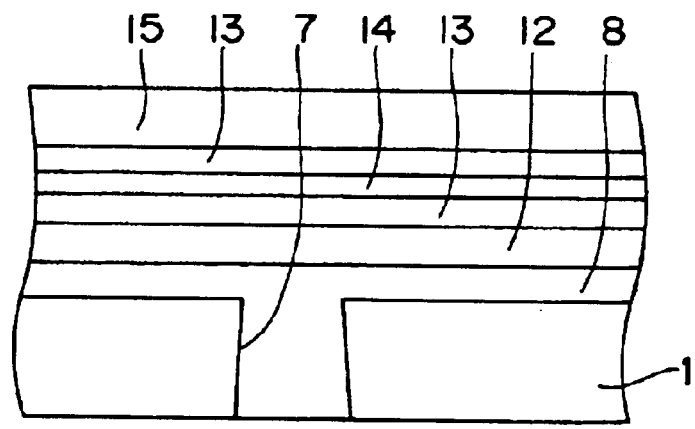
Figure 6C:
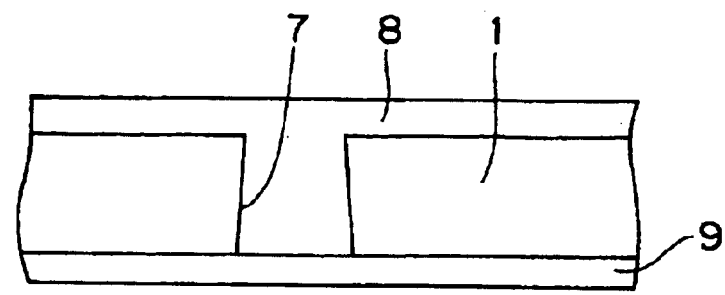

Next, a process for producing the semiconductor apparatus will be described using FIGS. 1A and 1B and FIGS. 6A through 6C. In FIG. 6A through FIG. 6C, the HBTs 100, polyimide resin 5, first wiring 6 and feeding metal wiring 20 are not shown for the sake of simplicity.

First, as shown in FIG. 1A and FIG. 1B, a plurality of HBTs 100, which each include an emitter layer 2, a base layer 3, a collector layer 4, an emitter ohmic metal layer 23, a base ohmic metal layer 24 and a collector ohmic metal layer 25, are arranged in parallel on the front surface of the (100) crystal plane of the GaAs substrate 1. Then, a collector metal wiring 21 and a base metal wiring 22 are formed. The collector ohmic metal layers 25 of the respective HBTs 100 are connected to the collector metal wiring 21 and the base ohmic metal layers 24 of the respective HBTs 100 are connected to the base metal wiring 22 whereby the HBTs are connected in parallel.

Then, a first wiring 6 connected to the emitter ohmic metal layer 23 of each HBT 100 is formed. This first wiring 6 is formed by the formation of a laminated film made of, for example, titanium (Ti)/platinum (Pt)/gold (Au) by an EB (electron beam) method. Before forming the collector metal wiring 21, the base metal wiring 22 and the first wiring 6, a photosensitive polyimide resin 5 is formed to a thickness of about 3 µm on a portion to overlap with the wirings of the HBT 100.

After that, using a positive type photoresist, for example, AZ4903 manufactured by Clariant Japan Co., a mask is formed by a conventional photolithography process. This mask is formed with a rectangular-shaped opening pattern wherein the opening width is in the range of 5 µm–20 µm, and the opening length is in the range of 30 µm–60 µm, for example. That is, in the above mask, the shorter side of the opening pattern is about 5 µm–20 µm, while the longer side thereof is about 30 µm–60 µm. Sidewalls of the resist pattern for forming this opening pattern are perpendicular to the front surface of the GaAs substrate 1. At this time, the above mask is formed so that the longer side of the opening pattern is parallel to the [011] direction of crystal orientation of the GaAs substrate 1.

Subsequently, using a dry etching apparatus capable of providing high-density plasma in a highly vacuum state, for example, an ICP (Inductively Coupled Plasma) etching apparatus, etching holes 67 for forming via holes are formed (see FIG. 6A in which only one etching hole is shown). At this step, dry etching is performed using a mixed gas of $Cl_2$ and $SiCl_4$ while cooling the backside of the GaAs substrate 1 with He gas or the like so that the depth of the etching hole 67 is about 100 µm. At this time, since the longer side of the opening pattern is parallel to the [011] direction of crystal orientation of the GaAs substrate, the width of the bottom of the etching hole 67 is broader than that of the mouth of the etching hole 67. That is, the width of the etching hole 67 increases from the mouth toward the bottom. Accordingly, even if the mouth of the etching hole 67 is small, it is possible to deepen the etching hole 67.

After forming the feeding metal wiring 20, the surface metal layer 8 is formed by an electrolytic plating method. Thereby, the etching hole 67 is completely filled with the surface metal layer 8, and also the surface metal layer 8 is connected to the first wiring 6 through the feeding metal wiring 20. While rotating and revolving the GaAs substrate 1, Ti, Pt and Au layers are formed to the thicknesses of about 50 nm, 20 nm and 40 nm, respectively, by an EB deposition method or a sputtering method to form the feeding metal wiring 20. In the metal wiring 20, the Ti layer secures the adhesion to the GaAs substrate 1, the Au layer reduces the wiring resistance, and the Pt layer between the Ti layer and the Au layer suppresses an increase in the resistance due to a reaction of Ti with Au during a heat treatment step in the production. When the electrolytic plating method is adopted as a method of forming the surface metal layer 8, a pulse plating method in which a current applied to a plating solution is switched on and off repeatedly is preferred from the viewpoint of making the deposition rate of the film within the etching hole 67 equal to the deposition rate of the film on the front side of the GaAs substrate 1.

Thereafter, as shown in FIG. 6A, a photoresist film 12, which is one example of an organic protective film, is formed on the front surface of the GaAs substrate 1 to a film thickness of several micrometers to several tens of micrometers by a spin coating method or any other suitable method. Then, a supporting substrate 15 is placed thereon via a sheet 14, both the surfaces of which are provided with adhesive layers 13, 13 which deteriorate in adhesion by heating.

Then, as shown in FIG. 6B, the backside of the GaAs substrate 1 is polished until the bottom of the surface metal layer 8 in the etching holes 67 is exposed, whereby via holes 7 passing through the GaAs substrate 1 are formed in proximity of the HBTs 100 which are omitted from FIGS. 6A–6C as already noted. At this time, the via holes 7 have a hole edge taking a rectangular shape on the front side, and the longitudinal direction of the hole edge is parallel to the [011] direction of crystal orientation of the GaAs substrate 1. Then, the supporting substrate 15 is heated to about 100° C. to foam a thermal foaming agent contained in the adhesive layers 13. Thereby, the supporting substrate 15 becomes easy to peel off the protective layer 12 of the GaAs substrate 1.

Subsequently, the GaAs substrate 1 is washed to remove polishing debris, and then electrolytic Au plating is performed thereby forming a backside metal layer 9 to a thickness of about several micrometers to several tens of micrometers on the backside of the GaAs substrate 1 as shown in FIG. 6C. The backside metal layer 9 is connected to the emitter layers 2 of the HBTs 100 through the surface metal layer 8 formed within the via holes 7. After that, the GaAs substrate is divided into chips having an optional chip size, and a resultant chip is mounted to a printed circuit board, whereby a semiconductor apparatus is completed.

As described above, the etching holes 67 are formed in a manner such that the hole edge on the HBT 100 side takes a rectangular shape, and that the longitudinal direction of the hole edge is parallel to the [011] direction of crystal orientation of the GaAs substrate 1. Thereby, the width of the etching hole 67 increases from the front surface of the GaAs substrate 1 toward the backside thereof. Therefore, a deep etching hole 67, and hence a deep via hole 7, can be formed even if the hole size at the front surface, namely, on the HBT 100 side of the substrate, is small.

In the above case, the etching holes 7 are made after the HBTs 100 have been formed on the GaAs substrate 1. Alternatively, the etching holes 7 may be made before the HBTs 100 are formed on the GaAs substrate 1.

Figure 2A:
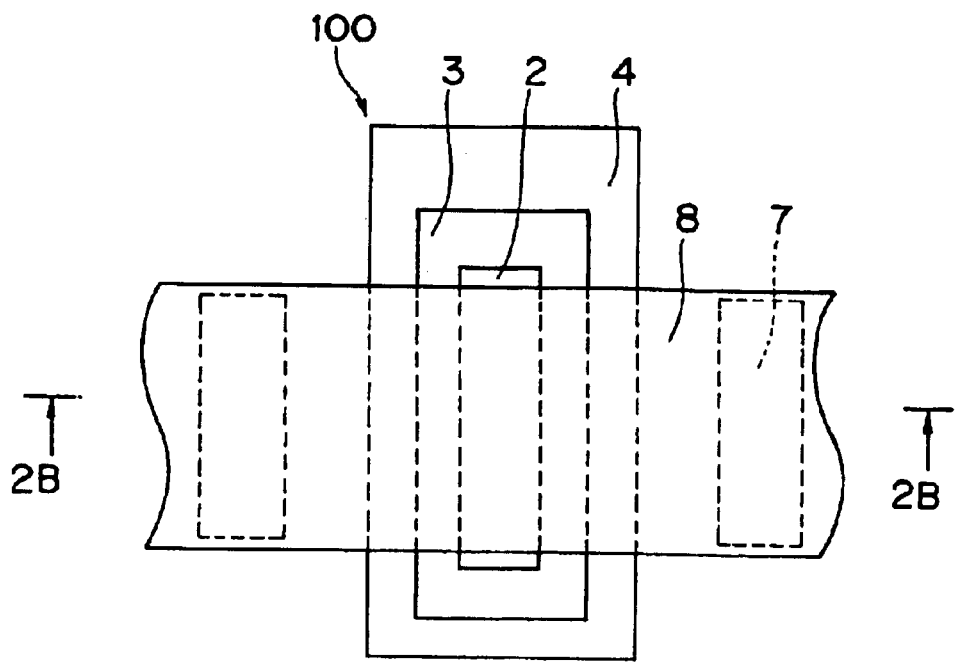
FIG. 2A is a schematic top plan view of an essential part of a semiconductor apparatus according to a modified embodiment of the present invention.
Figure 2B:
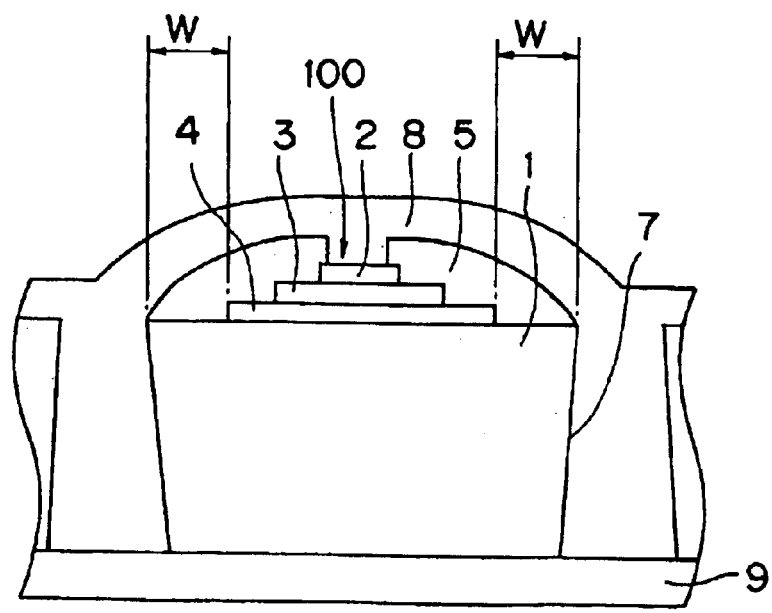
FIG. 2B is a schematic cross-sectional view taken along line 2B—2B of FIG. 2A.
Figure 3:
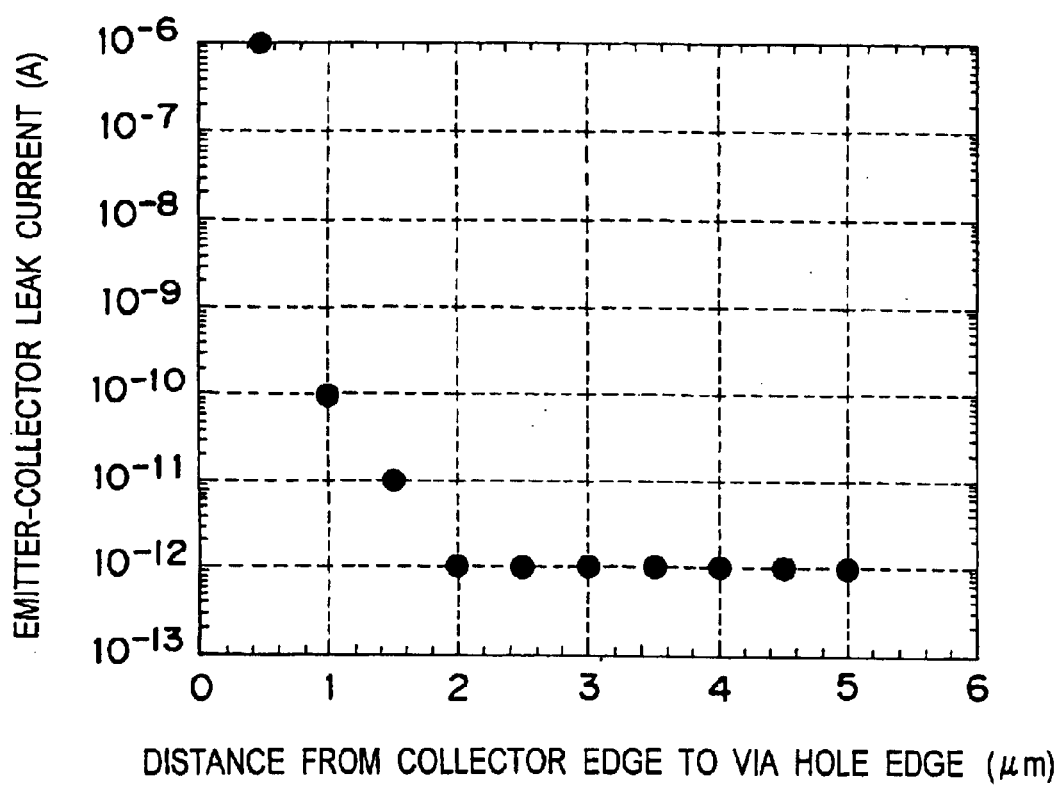
FIG. 3 is a graph showing the relationship between the emitter-collector leak current of an HBT and the distance from a collector edge to a via hole edge in the semiconductor apparatus of FIG. 2A and FIG. 2B.

Next, a leak current between the emitter layer 2 and the collector layer 4 (referred to as "emitter-collector leak current") will be discussed below using FIG. 2A, FIG. 2B and FIG. 3. In FIG. 2A and FIG. 2B, the same components as those in FIG. 1A and FIG. 1B are denoted by the same reference numerals used in FIG. 1A and FIG. 1B, and the description thereof is omitted.

As shown in FIGS. 2A and 2B, when an HBT 100 is formed on the front surface of the GaAs substrate 1, and a via hole 7 is provided in proximity thereof to connect an emitter layer 2 of the HBT to the via hole 7 via a surface metal layer 8, it is preferred that the collector layer 4 be spaced from the via hole to the extent that the distance W between an edge of the via hole on the side of the HBT 100 and an edge of the collector layer 4 of the HBT 100 is 2 $\mu$m or more. When the distance W is set to less than 2 $\mu$m, the emitter-collector leak current increases markedly as shown in FIG. 3. That is, the emitter-collector leak current can be suppressed by setting the distance W between the edge of the collector layer 4 and the edge of the via hole 7 to at least 2 $\mu$m. As a result, an improvement in the device characteristics and the reliability of the HBT 100 can be achieved.

Figure 4A:
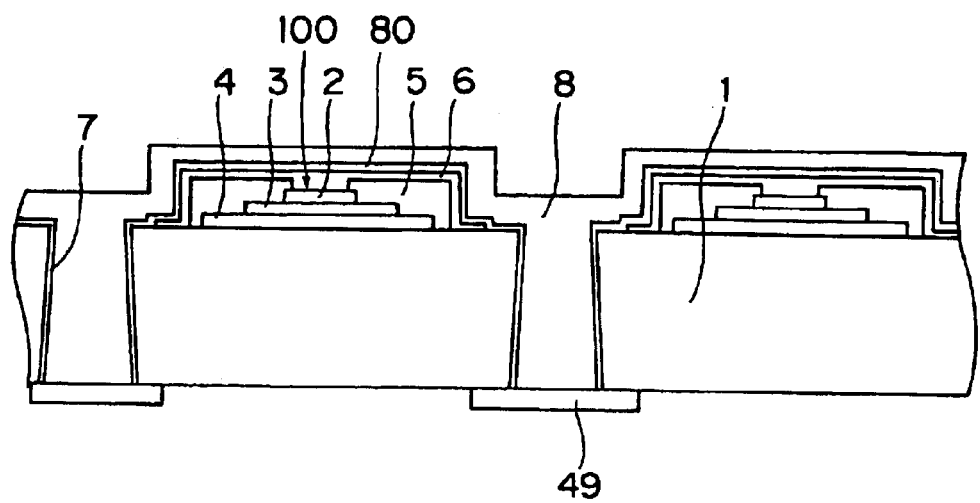
FIG. 4A and FIG. 4B are schematic cross-sectional views of a semiconductor apparatus according to a modified embodiment of the present invention.
Figure 4B:
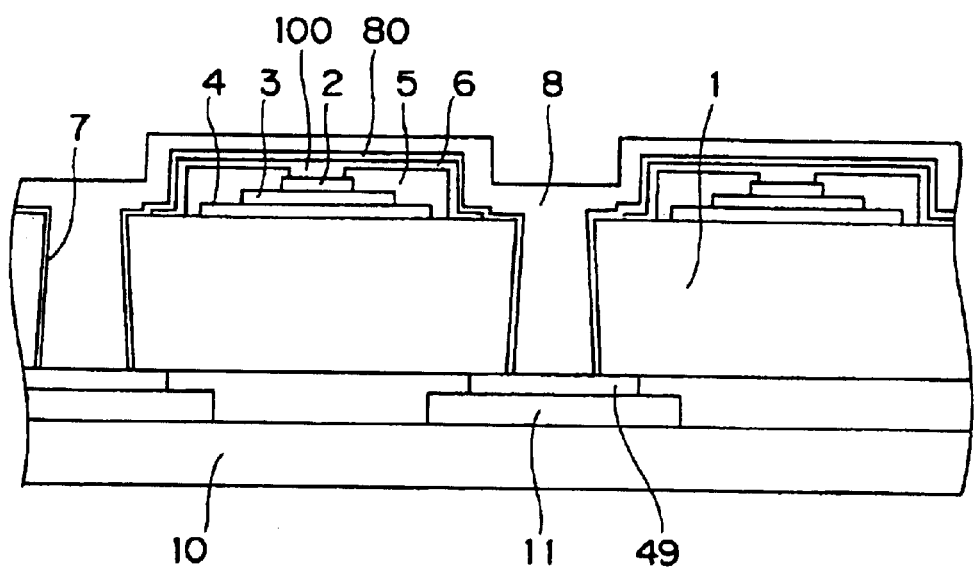

Next, a modification of the backside metal layer 9 will be described referring to FIG. 4A and FIG. 4B. In FIGS. 4A and 4B, the same components as those in FIGS. 1A and 1B are denoted by the same reference numerals used in FIGS. 1A and 1B, and the description thereof is omitted. The reference numeral 80 in FIG. 4A and FIG. 4B indicates a feeding metal wiring, which is one example of the second wiring formed between a surface metal layer 8 and a first wiring 6 and between the surface metal layer 8 and wall surfaces of a via hole 7.

As shown in FIG. 4A, a backside metal layer 49, which is only located in an area confronting the associated via hole 7 and its surrounding area, may be adopted. After slightly removing a GaAs substrate 1 to expose the bottom of the surface metal layer 8 within the via holes 7, the backside metal layer 49 is formed on the backside of the GaAs substrate 1 in a manner so as to take a shape covering and surrounding the associated via hole 7. As shown in FIG. 4B, each backside metal layer 49 is connected to a wiring part or wiring pattern 11 of a printed circuit board 10. This allows connections of not only a grounding wiring but also a signal line and a power source line via wirings within the via hole. Therefore, a reduction in the resistance and inductance of the respective wirings can be achieved, which makes it possible to improve the performance of elements.

Figure 5A:
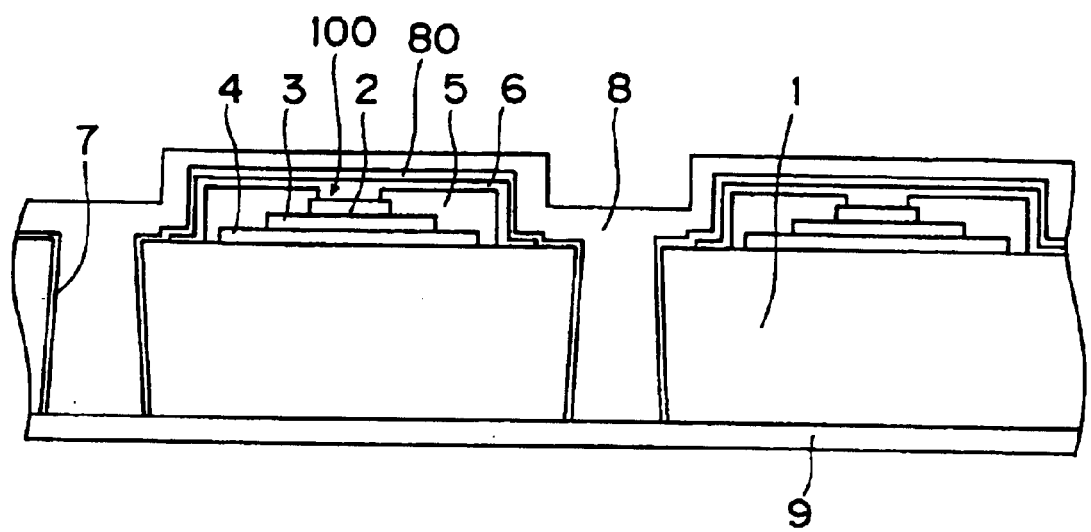
FIG. 5A and FIG. 5B are schematic cross-sectional views of a semiconductor apparatus according to a modified embodiment of the present invention.
Figure 5B:
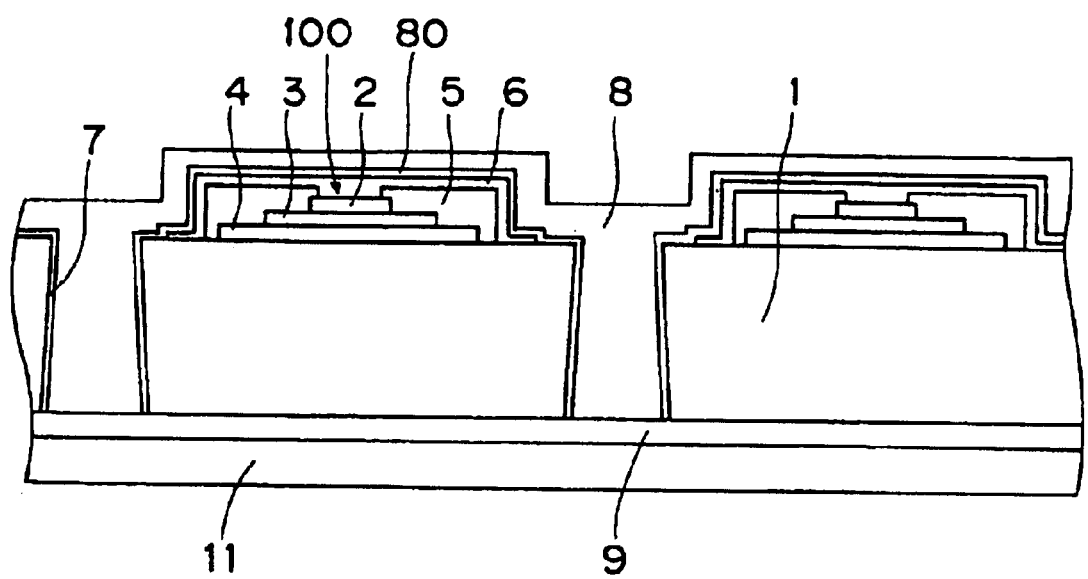

Next, the material of the backside metal layer 9 will be discussed using FIG. 5A and FIG. 5B. In FIG. 5A and FIG. 5B, the same components as those in FIGS. 1A and 1B and FIGS. 4A and 4B are denoted by the same reference numerals as those used in FIGS. 1A and 1B and FIGS. 4A and 4B, and the description thereof is omitted. It should be noted that the following description about the backside metal layer 9 is also true of the backside metal layer 49.

As the material of the backside metal layer 9 shown in FIG. 5A and FIG. 5B, for example, an alloy of gold and tin can be used. An alloy film of gold and tin is formed on the backside of the GaAs substrate 1 by a plating method or any other appropriate method. Then, in joining the GaAs substrate 1 to a printed circuit board, heat treatment is conducted to fuse the alloy of gold and tin, whereby a wiring part 11 of the printed circuit board is connected to the backside metal layer 9.

In this way, by the use of the alloy of gold and tin as the material of the backside metal layer 9, it is possible to join the backside metal layer 9 to a printed wiring board just by heating at a temperature of about 300° C. in mounting the chip-shaped semiconductor apparatus onto the printed wiring board.

Heat generated in the semiconductor elements, HBTs, during the operation is transferred to the backside metal layer 9 through a surface metal layer 8 within via holes 7 and then released to the printed circuit board. Since the backside metal layer 9 is made of the alloy of gold and tin, a reduction in the heat resistance of heat radiating paths can be achieved and therefore an improvement in the reliability of the semiconductor apparatus can be realized.

Figure 7A:
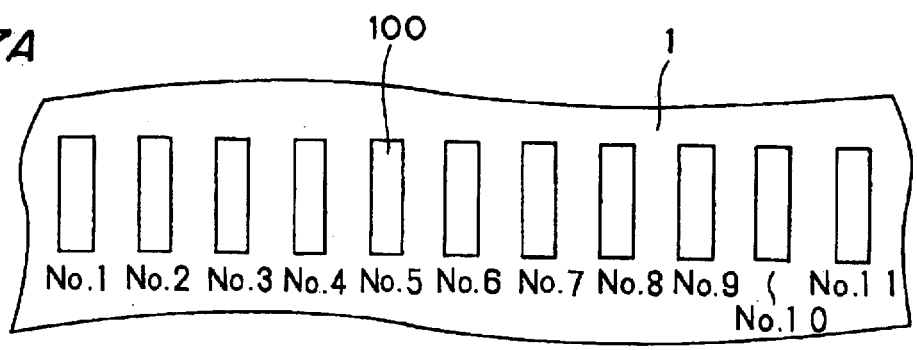
FIG. 7A is a top plan view of an essential part of a semiconductor apparatus in which a GaAs substrate is provided with no via hole.
Figure 7B:
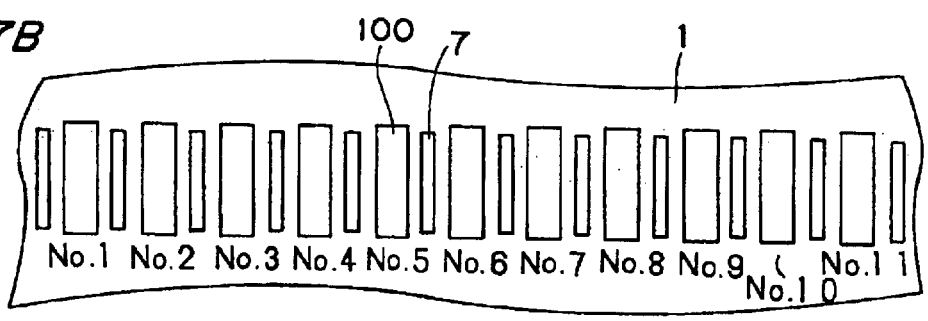
FIG. 7B is a top plan view of an essential part of a semiconductor apparatus in which via holes 7 are provided in a GaAs substrate on either side of all HBTs.
Figure 7C:
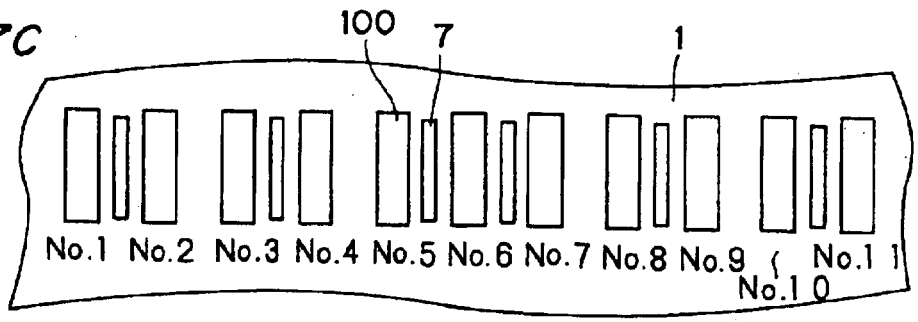
FIG. 7C is a schematic top plan view of an essential part of a semiconductor apparatus in which via holes are provided in a GaAs substrate at different intervals.

Next, the heat generation at the time of the operation of the HBTs 100 will be discussed below using FIGS. 7A through 7C, and FIG. 8. In FIGS. 7A–7C, the same components as those in FIGS. 1A and 1B are denoted by the same numerals as those used in FIGS. 1A and 1B, and the description thereof is omitted.

FIG. 7A is a schematic view of an essential part of a semiconductor apparatus as seen from above in which a plurality of HBTs 100 are arranged in parallel on a GaAs substrate 1 and the GaAs substrate 1 is provided with no via hole. FIG. 7B is a schematic view of a corresponding essential part of a semiconductor apparatus as seen from above in which a via hole 7 is provided on either side of all of a plurality of HBTs 100, namely, the via holes 7 are arranged at regular intervals and alternate with the HBTs 100. FIG. 7C is a schematic view of a corresponding essential part of a semiconductor apparatus as seen from above, in which via holes 7 are provided in a GaAs substrate 1 at irregular or different intervals. Although metal wirings are omitted from FIG. 7A through FIG. 7C, it should be appreciated that an emitter layer of each HBT 100 in FIG. 7B and FIG. 7C is connected to a backside metal layer through a surface metal layer.

Figure 8:
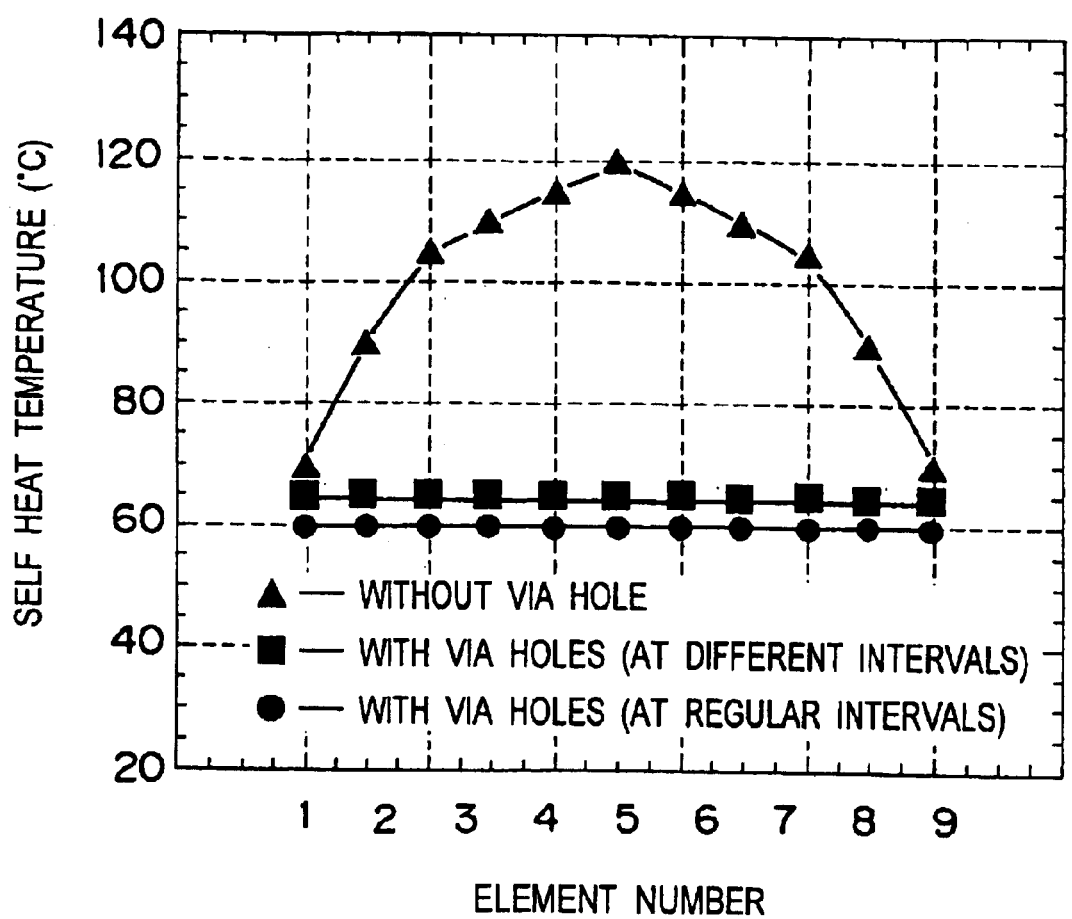
FIG. 8 is a graph showing the operation heat temperature distribution of parallel connection HBTs in each of the semiconductor apparatuses shown in FIGS. 7A–7C.

FIG. 8 is a graph showing the operation heat temperature distribution of the parallel connection semiconductor elements, or HBTs, in each of the semiconductor apparatuses shown in FIG. 7A, FIG. 7B and FIG. 7C. Element numbers in FIG. 8 correspond to No. X (X=1–11) of the HBTs 100, respectively, in FIG. 7A through FIG. 7C.

As shown in FIG. 8, in the case in which no via hole 7 is provided, namely, in the case of the semiconductor apparatus shown in FIG. 7A, the temperature of the HBT 100 of element No. 5 becomes the highest of all the parallel connection HBTs 100. Contrary to this, in the case in which a via hole is provided on either side of all the HBTs 100, namely, in the case of the semiconductor apparatus shown in FIG. 7B, uniform temperature distribution is achieved. In the case in which at least one via hole is provided for two HBTs 100, namely, in the case of the semiconductor apparatus shown in FIG. 7C, uniformity of the temperature distribution is maintained, though the temperature of the whole semiconductor apparatus increases slightly compared with that of the semiconductor apparatus shown in FIG. 7B.

As described above, in the case in which a plurality of HBTs 100 are connected in parallel and via holes 7 are provided in every space between adjacent HBTs 100 (namely, two via holes 7 correspond to one HBT 100), the heat temperature distribution of all the elements are made uniform. Therefore it is possible to achieve the stable operation and high reliability of the semiconductor apparatus. Further, even if the via holes 7 are not provided on both sides of the individual HBTs, but only one side of the via holes 7 (namely, one via hole 7 corresponds to one HBT 100), it is similarly possible to achieve the uniformity of the heat temperature distribution. In addition, in the latter case, the degree of freedom of devise design is improved.

Figure 9:
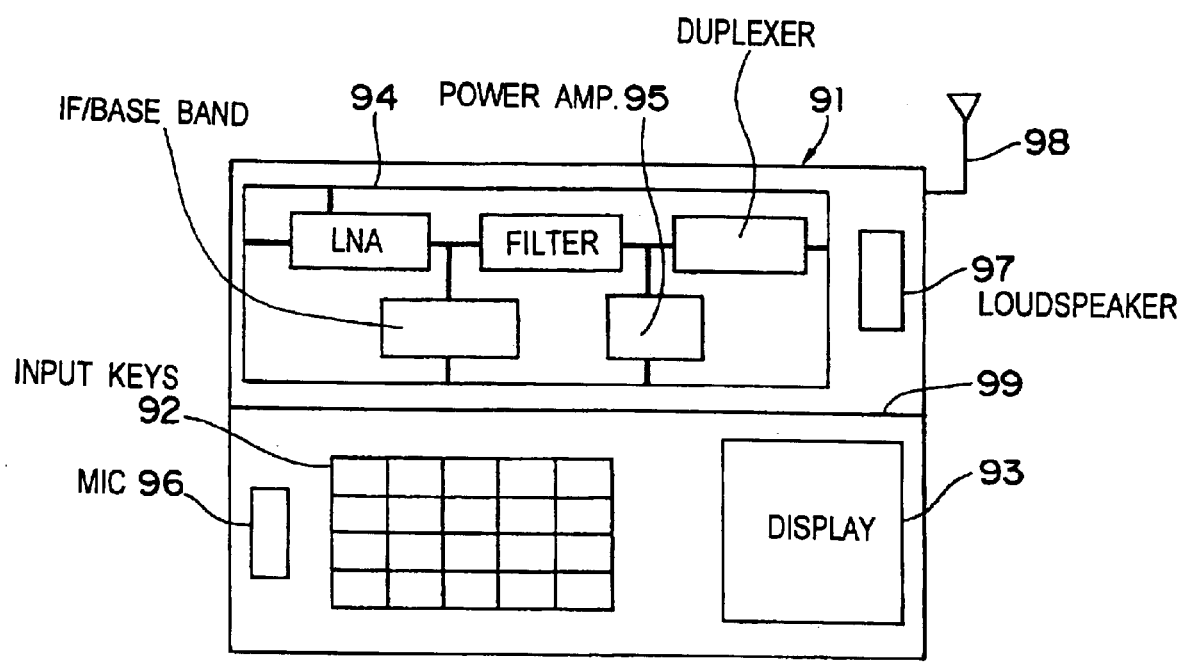
FIG. 9 is a schematic diagram of a transceiver according to one embodiment of the present invention.
Figure 10:
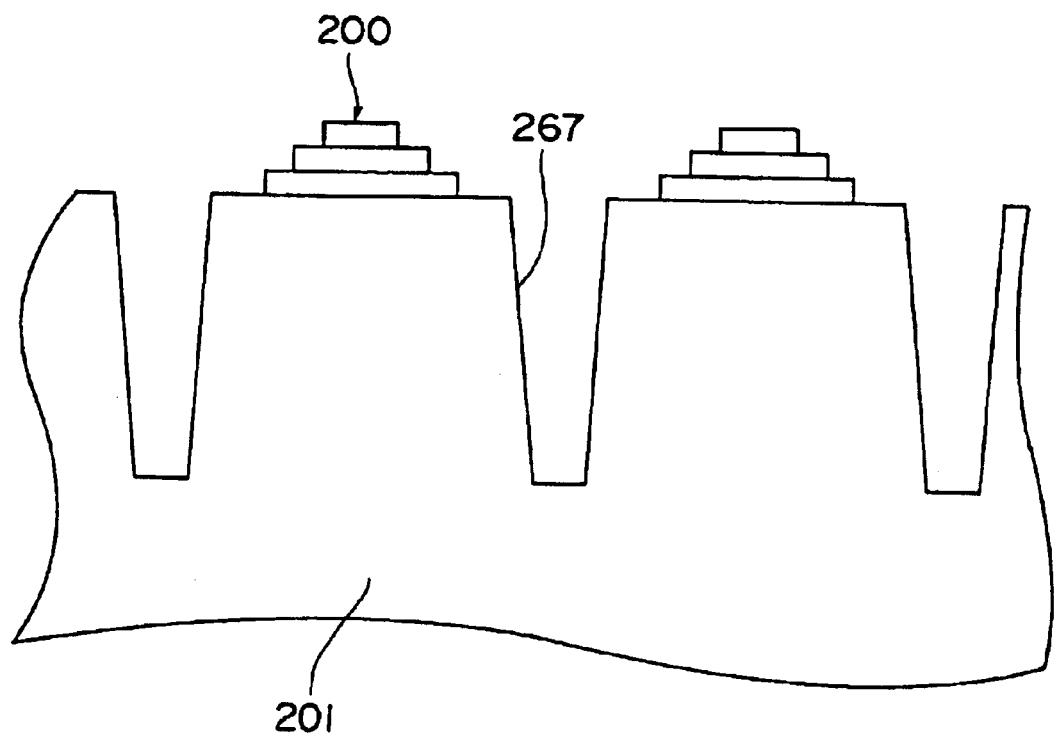
FIG. 10 is a schematic cross-sectional view of one step of a conventional process for producing a semiconductor apparatus.
Figure 11:
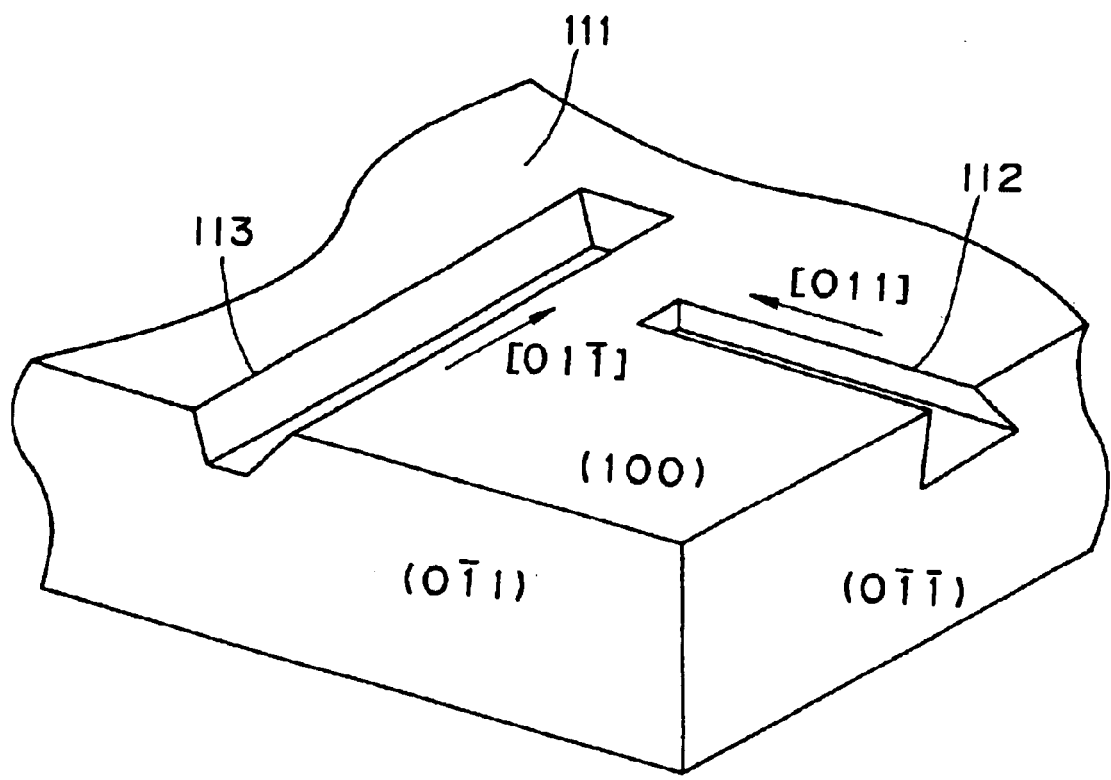
FIG. 11 is a view for explaining the principle of the present invention.

Referring next to FIG. 9, a folding-type portable information terminal equipment, which is one example of the transceiver according to one embodiment of the present invention, is described. In FIG. 9, reference numeral 91 generally indicates the folding-type portable information terminal equipment, reference numeral 92 indicates input keys, reference numeral 93 indicates a display, reference numeral 94 indicates a circuit board, reference numeral 95 indicates a power amplifier, reference numeral 96 indicates a microphone, reference numeral 97 indicates a loudspeaker, reference numeral 98 indicates an antenna, and reference numeral 99 indicates a bending part.

In the portable information terminal equipment 91, the semiconductor apparatus of the present invention is used for the power amplifier 95. Since the main power source of a machine like the above portable information terminal equipment is a storage battery, it is required that the power consumption of electronic circuits of the whole machine be reduced to elongate the life of the battery. In the portable information terminal equipment 91, the semiconductor apparatus of the present invention is used for the power amplifier 95. Thus high gain performance is realized at a high efficiency. Moreover, low power consumption of the elements is realized. As a result, a longer life of the battery (not shown) in the portable information terminal equipment 91 is realized.

In the above embodiments, the first wiring 6 is formed such that the first wiring 6 extends along the polyimide resin 5 from its left-side end portion to its right-side end portion as viewed in FIG. 1B. However, the first wiring 6 may be formed along the polyimide resin 5 from an inward portion of its left-side end to an inward portion of the right-side end. In short, the first wiring 6 is only required to be formed at least along a portion of the length of the polyimide resin 5 and connected to the emitter ohmic metal layer 23.

Further, in the above embodiments, as shown clearly in FIG. 1B, the surface metal layer 8 is connected to the emitter layer 2 via the first wiring 6 and the metal wiring 20. Alternatively, the surface metal layer 8 may be connected to the emitter layer 2 directly, as shown in FIG. 2B. The surface metal layer 8 is only required to be electrically connected to at least one of the emitter ohmic metal layer 23, the base ohmic metal layer 24 and the collector ohmic metal layer 25.

In the above embodiments, a part of the surface metal layer 8 is embedded within the via hole 7. That is, in the above embodiments, the surface metal layer, which is located above the HBTs 100 and connected to an electrode of the HBT 100, is integral with the via hole conductor embedded within the via hole 7. Alternatively, the surface metal layer located above the HBT 100 and the via hole conductor embedded within the via hole 7 may be separate from each other. Further, the surface metal layer located above the HBT 100 and the via hole conductor embedded within the via hole 7 may be made of the same material, or may be made of different materials.

As the supporting substrate 15, a silicon substrate, a quartz substrate, a glass substrate, or the like may be used. The GaAs substrate 1 may be semi-insulating.

In the above embodiment, the backside of the GaAs substrate 1 is polished in order to expose the surface metal layer 8 within the via hole. Alternatively, the backside of the GaAs substrate 1 may be ground.

Provision of at least one via hole 7 in correspondence to one HBT 100 suffices in order to allow the heat temperature of a plurality of HBTs to be uniform.

After being polished, the backside of the GaAs substrate 1 may be etched by a thickness of about several micrometers with an aqueous solution, such as an aqueous hydrofluoric acid solution, an aqueous nitric acid solution or an aqueous hydrochloric acid solution.

A feeding metal layer made of a Ti/Au layer with a thickness of about 50 nm–500 nm may be also formed between the backside metal layer 9, 49 and the GaAs substrate 1. This feeding metal layer can be formed by the EB deposition method, the sputtering method or the like.

Although the etching holes 67 are formed by dry etching in the above embodiments, they may be formed by wet etching as well.

In the above embodiment, the present invention is applied to a semiconductor apparatus using HBTs 100 as semiconductor elements. However, the present invention is also applicable to semiconductor apparatuses using MESFETs, HEMTs or the like as semiconductor elements. Even if MESFETs or HEMTs are used in place of the HBTs 100, similar effects can be achieved.

Further, the semiconductor apparatus of the present invention can be used for portable electronic equipment such as a mobile phone and a PDA (Personal Digital Assistant). In this case, the power consumption of the portable electronic equipment is reduced, and the life of the battery loaded therein becomes longer.

As is apparent from the above description, according to the present invention, when forming a semiconductor apparatus which has a plurality of parallel connection HBTs formed on the (100)-plane front surface of a GaAs substrate and which achieves a high output in a high-frequency band, rectangular-shaped via holes passing through the substrate are provided in proximity of the HBTs, and the emitter layer of the HBT, the associated via hole, and a backside metal layer of the substrate are mutually connected through a metal wiring, and then the backside metal layer is connected to a printed circuit board to provide a grounding electrode, whereby a reduction in the resistance and inductance of the grounding wiring can be achieved.

Further, the rectangular-shaped via hole is pattered with the photoresist mask so that the longer side of the rectangular-shaped via hole is parallel to the [011] direction of crystal orientation of the GaAs substrate, and then the GaAs substrate is etched by the reactive etching method using the chlorine-type gas. This makes it possible to form a deep via hole of which the opening width is narrow (for example, a via hole having a shorter side of 10 μm, a longer side of 50 μm and a depth of 100 μm or more). Thereby, highly precise control of the distance between the HBT and the via hole can be realized, thus making it possible to improve the device characteristics. Further, the final thickness of the substrate can be made as thick as 100 μm or more, whereby handling performance of the substrate and chips after separation is improved, and the occurrence of cracks in the chips and/or the substrate is prevented. This leads to a high yield in the production steps.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor apparatus comprising:
    a GaAs substrate having a front surface and a back surface, the front surface consisting of a (100) crystal plane;
    a plurality of semiconductor elements formed on the front surface of the GaAs substrate, each semiconductor element having a plurality of electrodes;
    a surface metal layer connected to at least one of the electrodes of each semiconductor element and located above the semiconductor elements;
    a backside metal layer provided on the back surface of the GaAs substrate;
    via holes passing through the GaAs substrate and located in proximity of the semiconductor elements; and
    via hole conductors embedded within the via holes;
    wherein at least one via hole is provided in correspondence with one semiconductor element, each via hole having a hole edge rectangular in shape at the front surface, and a longitudinal direction of the hole edge of the via hole is parallel to the [011] direction of crystal orientation of the GaAs substrate.

2. The semiconductor apparatus according to claim 1, further comprising:
    a first wiring formed between the surface metal layer and the at least one electrode of each semiconductor element;
    a second wiring formed between the surface metal layer and the first wiring and between the via hole conductor and wall surfaces of each via hole; and
    an organic insulating film formed between the first wiring and each semiconductor element.

3. The semiconductor apparatus according to claim 2 wherein the second wiring consists of a laminated film of titanium/platinum/gold.

4. The semiconductor apparatus according to claim 1, wherein each semiconductor element is at a distance of μm or more from the hole edge of the associated via hole.

5. The semiconductor apparatus according to claim 1, wherein the backside metal layer is only formed in a place confronting and surrounding the via holes.

6. The semiconductor apparatus according to claim 1, wherein the backside metal layer is formed or an alloy of gold and tin.

7. A transceiver having the semiconductor apparatus according to claim 1.

8. The substrate formed with a via hole according to claim 1, wherein the hole edge of the via hole at the front surface of the substrate has a width of 5 to 20 μm and a length of 30 to 60 μm and the via hole has a depth of 100 μm or more.

* * * * *